United States Patent
Yen et al.

[19]

[11] Patent Number: 6,136,661
[45] Date of Patent: Oct. 24, 2000

[54] METHOD TO FABRICATE CAPACITOR STRUCTURES WITH VERY NARROW FEATURES USING SILYATED PHOTORESIST

[75] Inventors: Tzu-Shih Yen, Hsin-Chu; Erik S. Jeng, Hsinchu, both of Taiwan

[73] Assignee: Vanguard International Semiconductor Corporation, Hsin-Chu, Taiwan

[21] Appl. No.: 09/332,430

[22] Filed: Jun. 14, 1999

[51] Int. Cl.[7] .................................................. H01L 21/20
[52] U.S. Cl. .......................... 438/396; 438/397; 438/717; 438/719
[58] Field of Search ..................................... 438/386, 387, 438/388, 389, 390, 396, 717, 719

[56] References Cited

U.S. PATENT DOCUMENTS

| | | | |
|---|---|---|---|
| 5,330,614 | 7/1994 | Ahn .......................................... | 438/396 |
| 5,380,673 | 1/1995 | Yang et al. ............................... | 438/396 |
| 5,399,518 | 3/1995 | Sim et al. ................................. | 438/396 |
| 5,663,093 | 9/1997 | Tseng et al. .............................. | 438/396 |
| 5,712,202 | 1/1998 | Liaw et al. ............................... | 438/253 |
| 5,753,419 | 5/1998 | Misium .................................... | 430/313 |
| 5,753,420 | 5/1998 | Misium .................................... | 430/313 |
| 5,759,892 | 6/1998 | Wang et al. .............................. | 438/254 |
| 5,759,893 | 6/1998 | Wu ........................................... | 438/254 |
| 5,926,719 | 7/1999 | Sung ........................................ | 257/303 |
| 6,004,845 | 12/1999 | Lin et al. ................................. | 438/253 |

*Primary Examiner*—Benjamin L. Utech
*Assistant Examiner*—Duy-Vu Deo
*Attorney, Agent, or Firm*—George O. Saile; Stephen B. Ackerman; Rosemary L. S. Pike

[57] ABSTRACT

A method of fabrication of a storage capacitors for DRAM memory cells using silylated photoresist is described. Partially completed DRAM memory cells comprising wordline transistor gates and bitline source and drain regions is provided. Conductive plugs are provided through a dielectric layer to the top surfaces of the bitline drain regions. A first conductive layer is deposited overlying the conductive plugs. A photoresist layer is deposited overlying the first conductive layer. The photoresist layer is etched to define the areas for the lower plates of the storage capacitors. The photoresist is exposed to a silylating agent to form a silylated layer. The top layer of the silylated photoresist is etched through to form a mask for subsequent etching. The photoresist layer is etched as defined by the mask. The first conductive layer is etched as defined by the mask to form the shape of the lower nodes of the storage capacitors. The remaining silylated photoresist is removed. A capacitor dielectric layer is deposited overlying the lower nodes of the storage capacitors. A second conductive layer is deposited to form the upper nodes of the storage capacitors. A passivation layer is deposited to complete fabrication.

20 Claims, 7 Drawing Sheets

METHOD TO FABRICATE CAPACITOR STRUCTURES WITH VERY NARROW FEATURES USING SILYATED PHOTORESIST

BACKGROUND OF THE INVENTION (1) Field of the Invention

The present invention relates to the fabrication of semiconductor structures, and more particularly, to a method of fabricating capacitor structures with very narrow features using silylated photoresist.

(2) Description of the Prior Art

As the feature size of DRAM memory cells continues to decrease, the area available for cell storage capacitors also decreases. Because of these trends it is essential that the capacitance per unit area of the cell capacitor structures is increased. One means of increasing the capacitance is to use special three-dimensional structures such as cylinders and crowns for the capacitors. However, fabricating these structures requires the ability to create very small line widths and spacings. The resolution of the photolithographic and etch processes limits the minimum size of such geometric features. To create very small line and space features for DRAM capacitors that exceed the limits of current processing, an alternative method of patterning and etching the photoresist mask is proposed.

The use of both cylinder and crown capacitor structures is demonstrated in the prior art. U.S. Pat. No. 5,759,893 to Wu teaches a process to make a rugged crown shaped capacitor using doped and undoped polysilicon and hot phosphoric acid etching. U.S. Pat. No. 5,712,202 to Liaw et al teaches a process to make a crown shaped polysilicon capacitor using multiple sidewall spacers and multiple etch back steps. U.S. Pat. No. 5,663,093 to Tseng et al shows the fabrication of a crown shaped polysilicon capacitor using multiple dielectric depositions and etch back steps. U.S. Pat. No. 5,759,892 to Wang et al teaches a method to form self-aligned cylindrical polysilicon capacitors by depositing and etching back several layers of polysilicon.

The use of silylated photoresist in the process of making a DRAM capacitor is also disclosed in the prior art. U.S. Pat. No. 5,753,419 to Misium teaches a method to form a capacitor structure where silylation and etching of photoresist is used to first form wavy vertical etches in the photoresist. An etch of the polysilicon then transfers the wavy pattern to the polysilicon capacitor. U.S. Pat. No. 5,753,420 to Misium teaches a method to form capacitors where silylation of photoresist and dry etching is used to form a top photoresist surface with remnants of photoresist residue. This residue is used as a mask to etch a ripple pattern on the top surface of the polysilicon.

SUMMARY OF THE INVENTION

A principal object of the present invention is to provide an effective and very manufacturable method of fabricating integrated circuits with DRAM memory cells.

A further object of the present invention is to provide an effective and very manufacturable method for fabricating integrated circuits with DRAM memory cells in which storage capacitors are fabricated using a silylated photoresist masking method.

A yet further object of the present invention is to provide a method for fabricating integrated circuits with DRAM memory cells in which crown shaped storage capacitors are fabricated using a silylated photoresist masking method.

Another yet further object of the present invention is to provide a method for fabricating integrated circuits with DRAM memory cells in which cylindrical storage capacitors are fabricated using a silylated photoresist masking method.

In accordance with the objects of this invention, a new method of fabricating an integrated circuit in which storage capacitors for DRAM memory cells are fabricated using a silylated photoresist masking method is achieved. A partially completed DRAM cell is provided including the wordline transistor gate and source and drain regions. A dielectric layer is provided overlying the partially completed DRAM cell. A conductive plug through the dielectric layer is provided to connect the underlying bitline contact to the planned storage capacitor of the DRAM cell. A first conductive layer is deposited overlying the dielectric layer and the conductive plug. A photoresist layer is deposited overlying the first conductive layer. The photoresist layer is patterned and etched to define the horizontal area of the planned storage capacitor overlapping at least a part of the underlying conductive plug. A silylated layer is formed in the surface of the photoresist to a controlled depth. The top surface of the silylated photoresist is anisotropically etched through. The unsilylated photoresist is etched using the remaining silylated photoresist as a mask. The first conductive layer is etched to define the shape of the lower node of the storage capacitor using the remaining silylated photoresist as a mask. The remaining silylated photoresist is removed. A capacitor dielectric layer is deposited overlying the lower capacitor node. A second conductive layer is deposited overlying the capacitor dielectric layer to form the upper node of the storage capacitor. A passivation layer is deposited overlying the second conductor and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
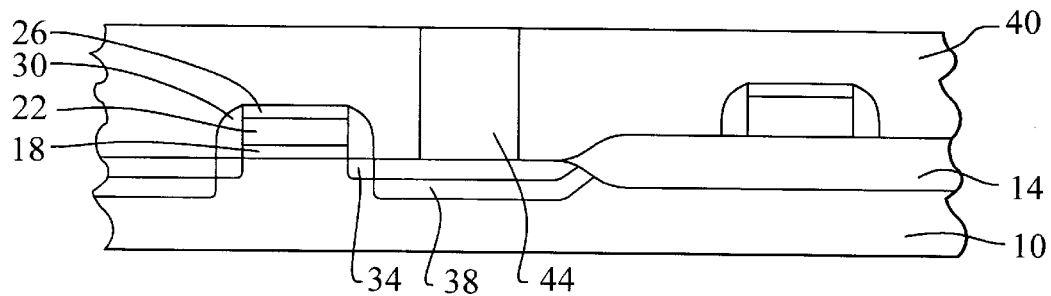
FIGS. 1 and 2 schematically illustrate in cross-sectional representation the first steps in the present invention.

Referring now more particularly to FIG. 1, there is illustrated a portion of a partially completed DRAM memory cell in an integrated circuit. Semiconductor substrate 10 is preferably composed of monocrystalline silicon. Isolation regions 14 have been formed in the substrate 10 to isolate active device areas. A DRAM bitline is shown made up of a gate oxide layer 18, a polysilicon gate 22, silicon nitride cap 26 and sidewall spacers 30. Source and drain regions 38 include lightly doped drains 34.

Overlying the DRAM cells is a dielectric layer 40. The dielectric layer 40 is preferably composed of a silicon nitride, silicon oxide, or a doped silicon oxide, such as phosphosilicate glass (PSG), or borophosphosilicate glass (BPSG). Conductive plug 44 is formed through the dielectric layer to contact the bitline drains. The conductive plugs are preferably composed of doped polysilicon or metals, such as tungsten, aluminum, and copper.

Figure 2:
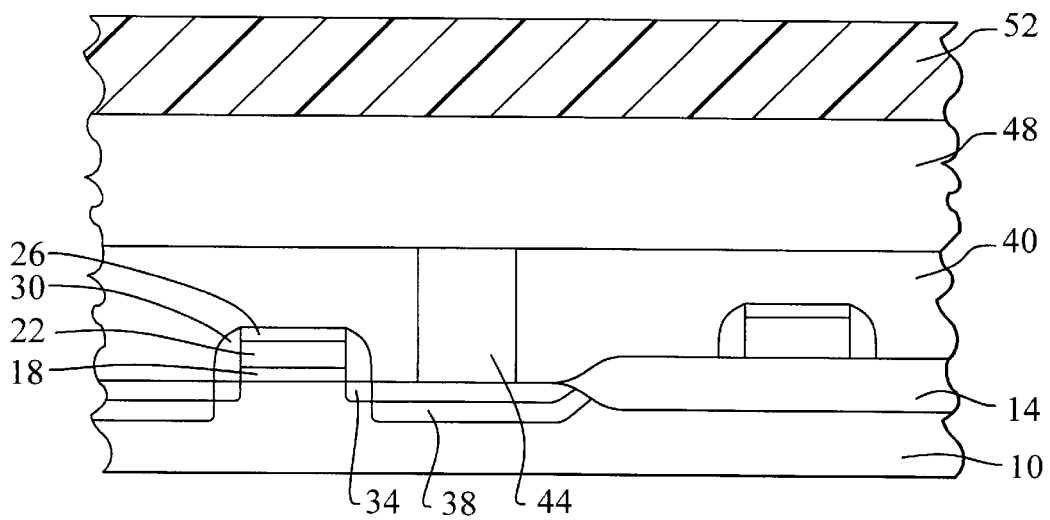

Referring now to FIG. 2, a first conductive layer 48 is deposited overlying the dielectric layer 40 and the conductive plugs 44. The first conductive layer is preferably formed of polysilicon or doped polysilicon. The first conductive layer preferably has a thickness of between about 2,000 Angstroms and 10,000 Angstroms. A polysilicon layer can be deposited by prolysing silane in a low pressure chemical vapor deposition process.

As shown in FIG. 2, a layer of photoresist 52 is coated onto the polysilicon layer 48 to a thickness of between about 2,000 Angstroms and 15,000 Angstroms. This photoresist may be either positive or negative tone and must be compatible with silylation.

Figure 3:
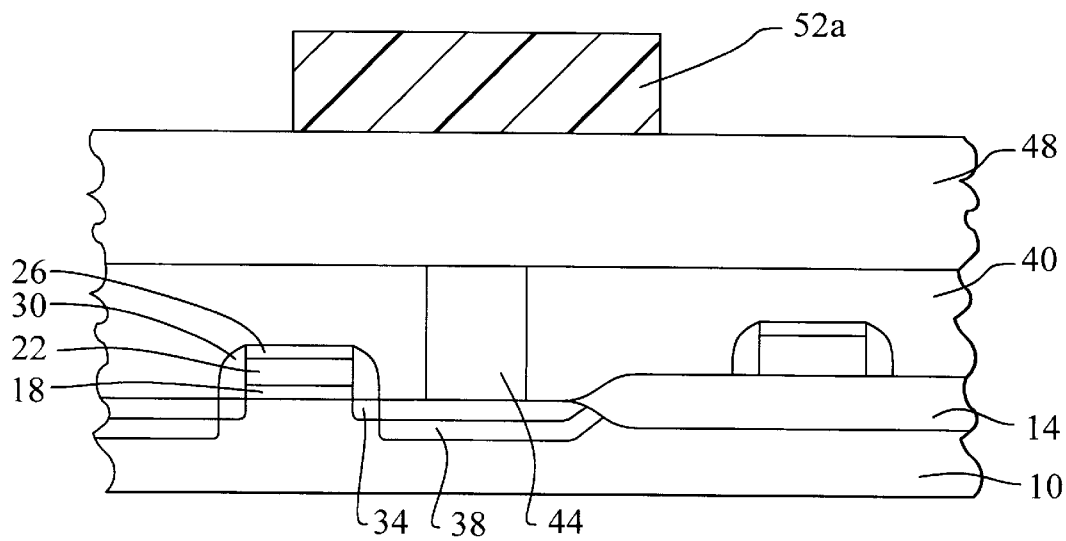
FIGS. 3 through 8 schematically illustrate in cross-sectional representation a first preferred embodiment of the present invention.

Referring now to FIG. 3, the details of the first preferred embodiment of the present invention are shown. In this embodiment, the present invention is used to create a crown shaped capacitor. The photoresist layer 52 is subjected to a conventional photolithography and etch sequence. The photoresist layer is etched to define the horizontal areas of the storage capacitors 52a. The photoresist layer 52 is left overlying completely the conductive plug 44.

Figure 4:
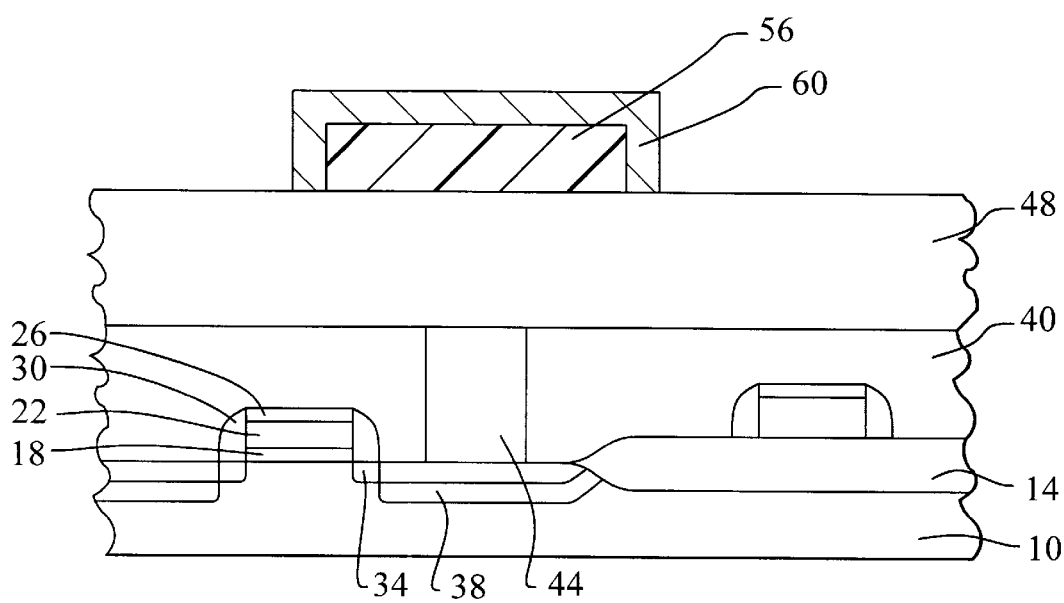

Referring now to FIG. 4, the silylation process is described. Silylation is simply the diffusion of silicon atoms into photoresist. Photoresist which has been silylated will become resistant to dry etching, such as $O_2$ reactive ion etching (RIE). During silylation, the photoresist is heated in an atmosphere containing a silylating agent and silicon atoms diffuse into the photoresist surface. In the preferred embodiment, the photoresist layer 60 is heated at between about 60 degrees C. and 80 degrees C. for between about 60 seconds and 300 seconds at between about 85 Torr and 150 Torr in an atmosphere of, for example, vapor phase dimethylsilyldimethylamine (DMSDMA). A silylated photoresist layer 60 is formed to a depth of between about 200 Angstroms and 2,000 Angstroms leaving an unsilylated photoresist layer 56. Repeatably controlling the depth of the silylated layer 60 is key to producing the thin sidewalls of the crown shaped capacitors. Alternatively, a silylation layer may be formed using a silane agent, such as dimethylsilyldiethylamine (DMSDEA), or disilane agent, such as dimethylaminopentamethyldisilane (DMDS) or N,N-dimethylamino-1,2dimethyldisilane (DMDS).

Figure 5:
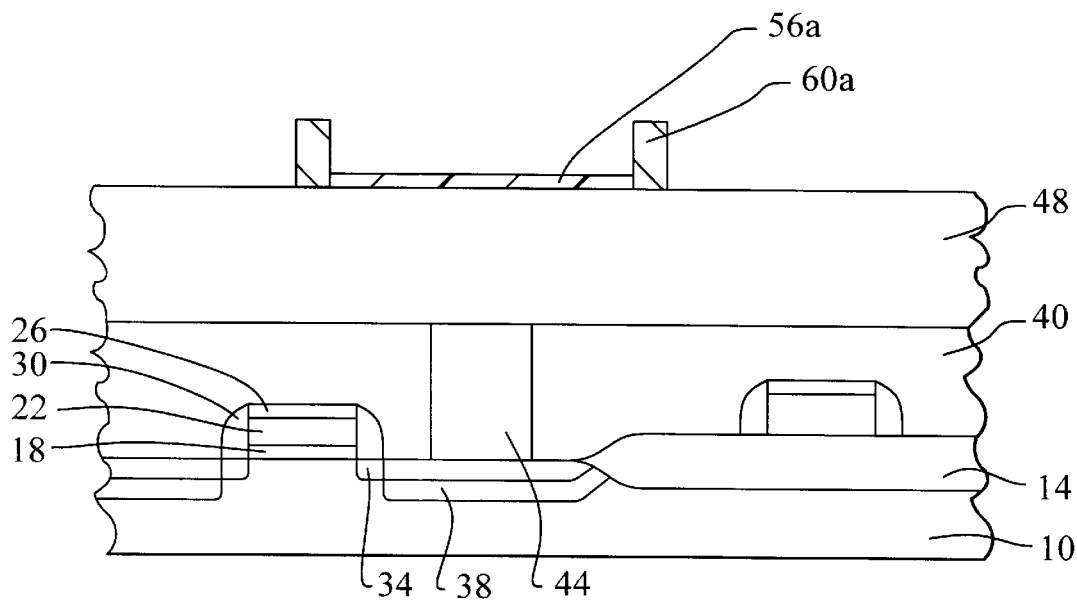

Referring now to FIG. 5, the photoresist etching is described. First, the top surface of the silylated photoresist layer 60 is etched. In an RIE chamber, an etch chemistry of $Cl_2$ and $O_2$ is used to create a plasma. With a bias voltage applied to the wafer, the plasma anisotropically breaks through and removes the top layer of silylated photoresist leaving vertical sidewalls 60a. The etch chemistry is then changed to $O_2$, $N_2$, and He with a lesser bias voltage. This chemistry will create plasma capable of etching the unsilylated photoresist layer 56a but not the silylated photoresist layer 60a. The unsilylated photoresist layer 56a is etched down to near the top surface of the first conductive layer 48. The etch is timed such that a thin layer of between about 1,000 Angstroms and 3,000 Angstroms of unsilylated photoresist 56a is left above the first conductive layer 48. The thin layer of unsilylated photoresist 56a is left so that a portion of the first conductive layer 48 will remain above the sidewalls.

Figure 6:
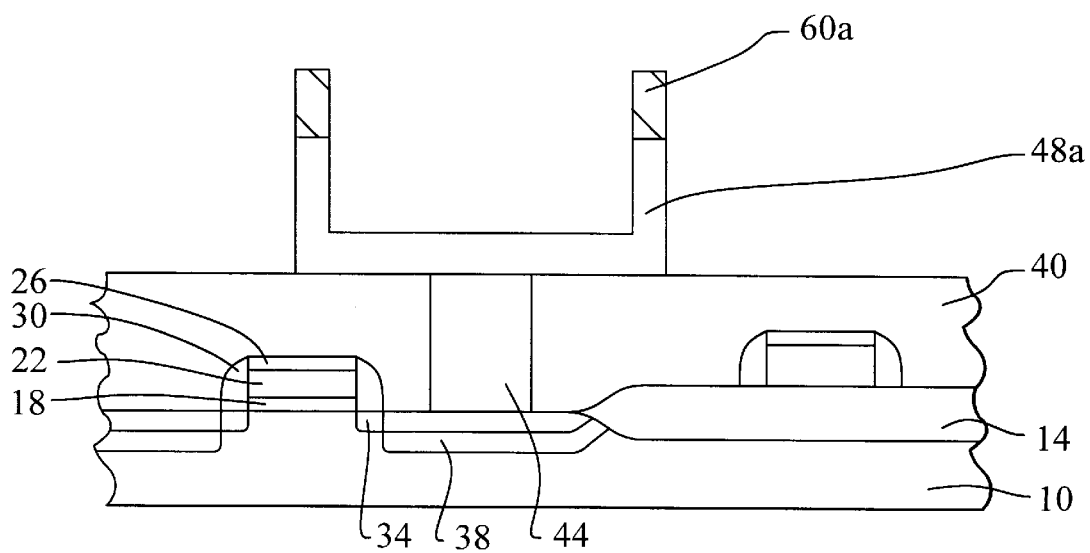

With the wafer still in the same RIE chamber, the etch chemistry is now changed to $Cl_2$, HBr, and $O_2$. This chemistry uses less $O_2$ than in nominal polysilicon etching and creates plasma capable of etching both the remaining unsilylated layer 56a and the polysilicon first conductive layer 48, but not the remaining silylated layer 60a. Referring to FIG. 6, this last etch creates vertical sidewalls in the first conductive layer 48a by using the remaining silylated photoresist 60a as an etching mask. This etch is timed such that between about 500 Angstroms and 2,000 Angstroms of the first conductive layer 48a is left overlying the dielectric layer 40.

Figure 7:
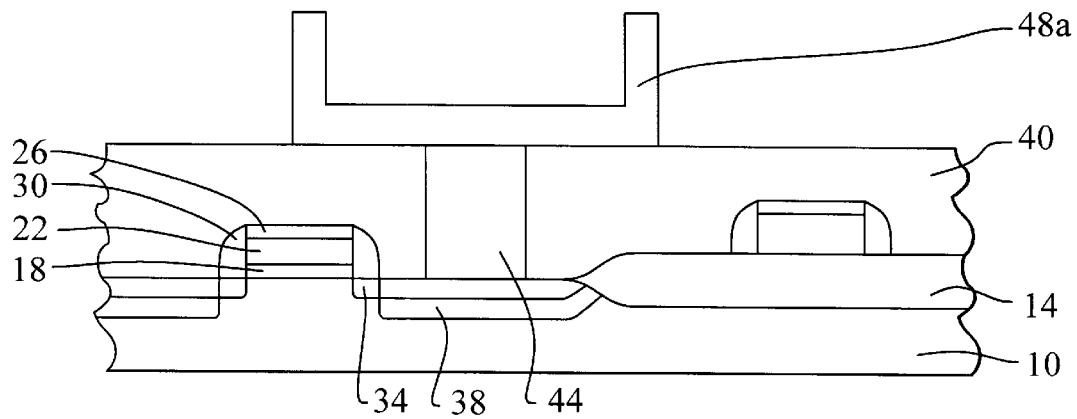

Referring now to FIG. 7, the remaining silylated photoresist is now removed to reveal the crown shaped lower node of the capacitor 48a.

Figure 8:
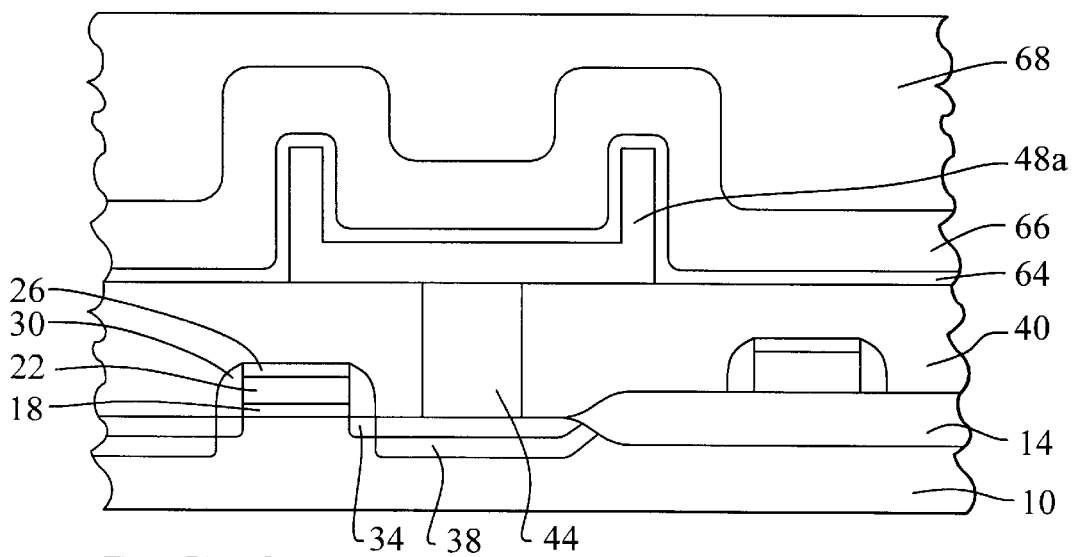

Referring now to FIG. 8, processing continues as is conventional in the art to complete the integrated circuit device. For example, a capacitor dielectric layer 64 is deposited overlying the lower node of the capacitor 48a. This capacitor dielectric layer 64 is preferably formed of an oxide-nitride-oxide (ONO) composite layer. A second conductive layer 66 is deposited overlying the capacitor dielectric layer 64. The second conductive layer 66 is preferably doped polysilicon. The second conductive layer forms the upper node of the storage capacitor. A passivation layer 68, preferably of plasma nitride, is deposited overlying the upper storage node to complete the integrated circuit device.

In a second preferred embodiment of the present invention, a cylindrical shaped capacitor is formed. Processing for the second preferred embodiment begins the same as for the first preferred embodiment up to and including the photoresist coating of FIG. 2. The photoresist layer 52 is now subjected to a conventional photolithography and etch sequence.

Figure 9:
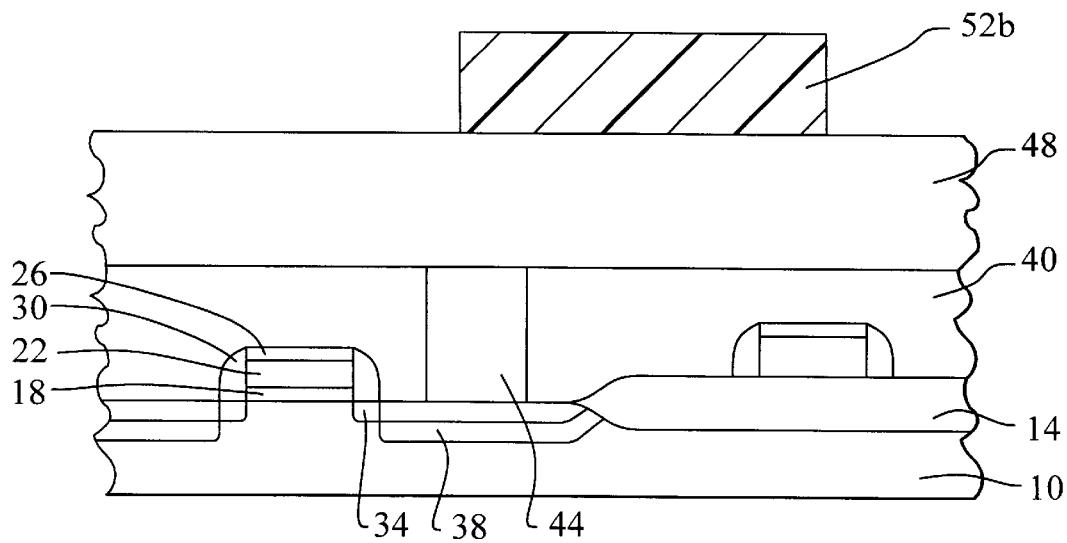
FIGS. 9 through 14 schematically illustrate in cross-sectional representation a second preferred embodiment of the present invention.

Referring now to FIG. 9, the photoresist layer is etched to define the horizontal areas of the storage capacitors 52b. The photoresist layer 52b is defined so that the edge intersects the conductive plug 44.

Figure 10:
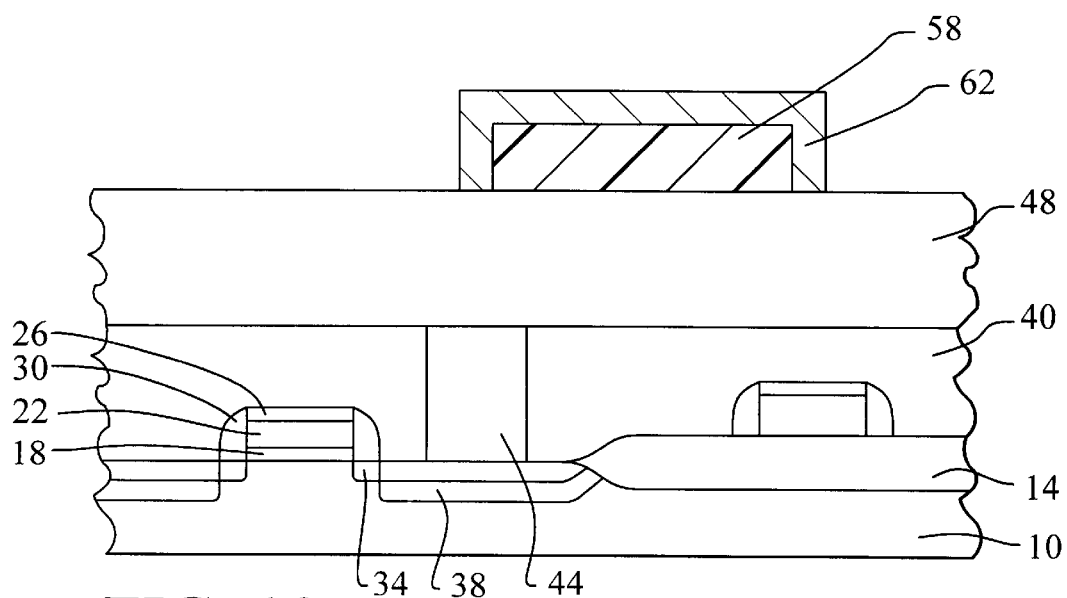

Referring now to FIG. 10, a silylated photoresist layer 62 is again formed to a depth of between about 200 Angstroms and 2,000 Angstroms leaving a unsilylated photoresist layer 58.

Figure 11:
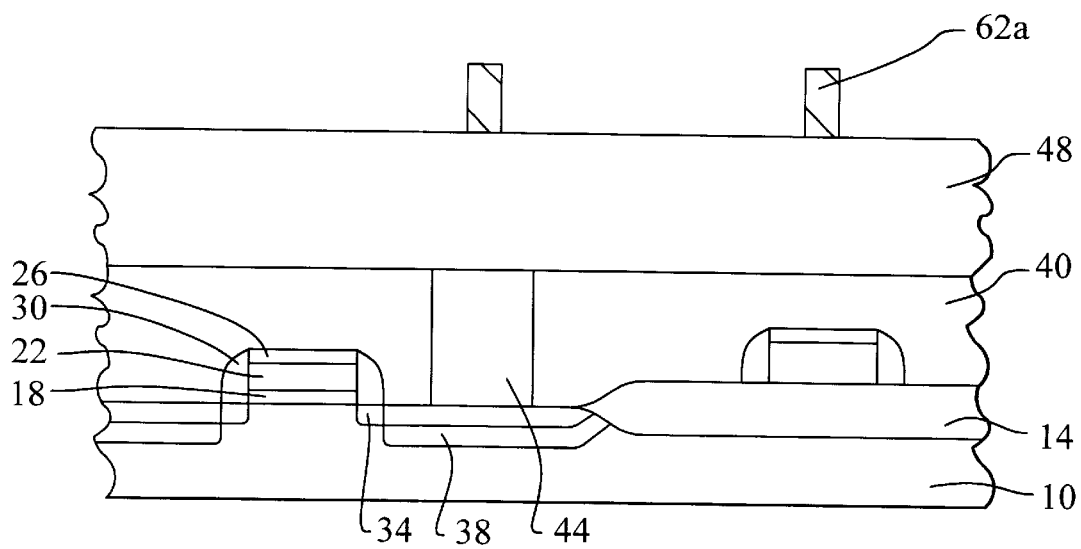

Referring now to FIG. 11, the photoresist etching is described. First, the top surface of the silylated photoresist layer 62 is etched. In an RIE chamber, an etch chemistry of $Cl_2$ and $O_2$ is used to create a plasma. With a bias voltage applied to the wafer, the plasma breaks through and removes the top layer of silylated photoresist 62 leaving the vertical edges 62a. The etch chemistry is then changed to $O_2$, $N_2$, and He with a lesser bias voltage. This chemistry will create plasma capable of etching the unsilylated photoresist layer 58 but not the silylated photoresist layer 62a. This allows the silylated photoresist 62a to act as an etch mask. The unsilylated photoresist layer 58 is etched through to the top surface of the first conductive layer 48. An optical endpoint detection method is used to insure complete etching through without overetching.

Figure 12:
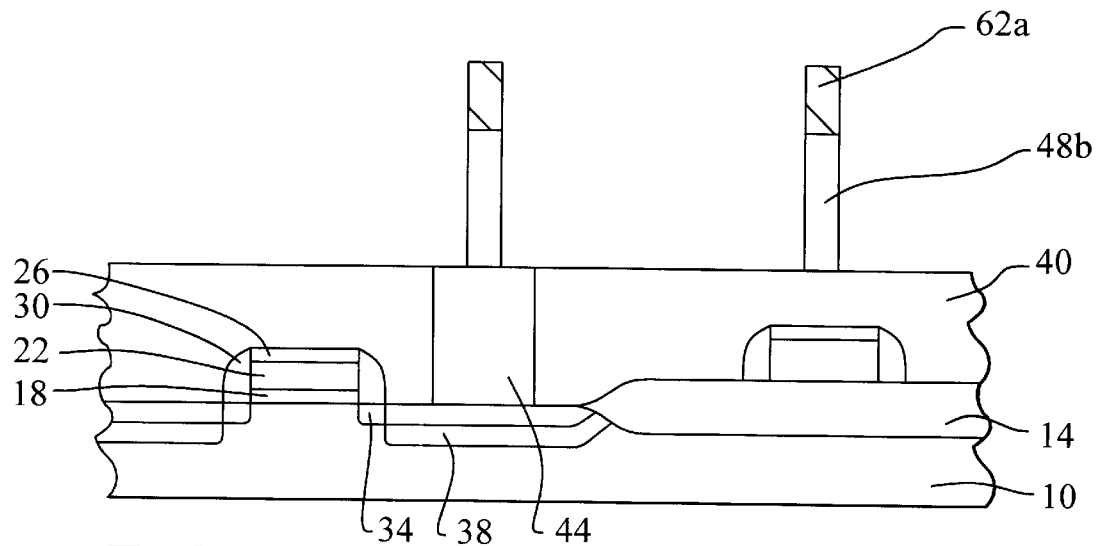

With the wafer still in the same RIE chamber, the etch chemistry is now changed to $Cl_2$, HBr, and $O_2$. Less $O_2$ is used than in nominal polysilicon etching. This chemistry creates plasma capable of etching the polysilicon first conductive layer 48, but not the remaining silylated layer 62a. Again, this allows the silylated photoresist to act as an etch mask. Referring to FIG. 12, this last etch creates vertical sidewalls in the first conductive layer 48b by using the remaining silylated photoresist 62a as an etching mask. An optical end-point detection is also used to insure complete etching through of the first conductive layer 48b down to the top surface of the dielectric layer 40 without overetching.

Figure 13:
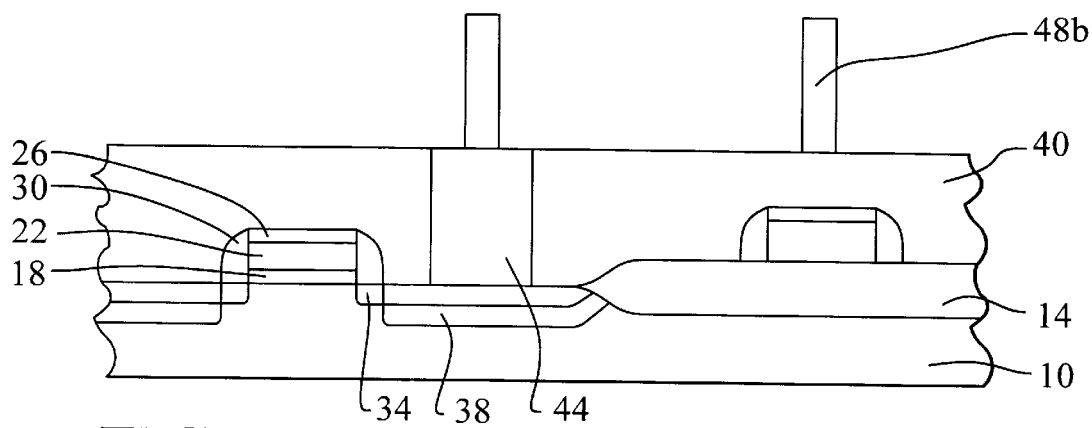

Referring now to FIG. 13, the remaining silylated photoresist is now removed to reveal the cylindrical shaped lower node of the capacitor 48b.

Figure 14:
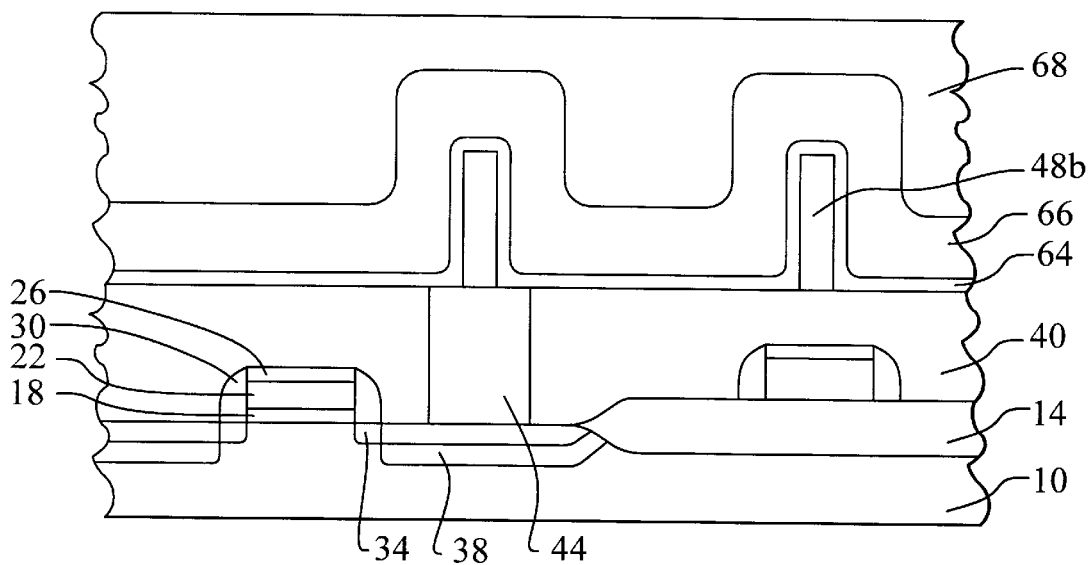

Referring now to FIG. 14, processing continues as is conventional in the art to complete the integrated circuit device. The capacitor dielectric layer 64 is deposited overlying the lower node of the capacitor 48b. A second conductive layer 66 is deposited overlying the capacitor dielectric layer 64. The second conductive layer forms the upper node of the storage capacitor. A passivation layer 68 is deposited overlying the upper storage node to complete the integrated circuit device.

The process of the present invention provides a very manufacturable process for fabricating DRAM storage capacitors in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of storage capacitors in an integrated circuit device comprising:

providing a semiconductor substrate where conductive plugs are formed through a dielectric layer;

depositing a first conductive layer overlying said conductive plugs and said dielectric layer;

depositing a photoresist layer overlying said first conductive layer;

patterning said photoresist layer to define a photoresist mask overlying said conductive plugs;

silylating said photoresist mask to form a top silylated photoresist portion overlying and silylated photoresist sidewalls adjacent to an inner unsilylated photoresist portion;

etching through said top silylated photoresist portion to expose the top surface of said inner unsilylated photoresist portion;

etching said inner unsilylated photoresist portion;

etching said first conductive layer and thereby forming the lower nodes of said storage capacitors wherein said silylated photoresist sidewalls act as an etching mask;

etching away remaining said said silylated photoresist sidewalls;

depositing a capacitor dielectric layer overlying said lower nodes of said storage capacitors and said dielectric layer;

depositing a second conductive layer overlying said capacitor dielectric layer and thereby forming the upper nodes of said storage capacitors; and completing said fabrication of said integrated circuit device.

2. The method according to claim 1 wherein said first conductive layer is comprised of polysilicon deposited to a thickness of between about 2,000 Angstroms and 10,000 Angstroms.

3. The method according to claim 1 wherein said photoresist layer is deposited to a thickness of between about 2,000 Angstroms and 15,000 Angstroms.

4. The method according to claim 1 wherein said step of silylating is performed using a silylating agent comprising one of the group of: dimethylsilyldimethylamine (DMSDMA), dimethylsilyldiethylamine (DMSDEA), dimethylaminopentamethyldisilane (DMDS), and N,N-dimethylamino-1,2dimethyldisilane (DMDS).

5. The method according to claim 1 wherein said top silylated photoresist portion and said silylated photoresist sidewalls are formed to a thickness of between about 200 Angstroms and 2,000 Angstroms.

6. The method according to claim 1 wherein said shape of the lower nodes of said storage capacitors is one of a group comprising crown shaped and cylindrical shaped.

7. The method according to claim 1 wherein said etching through of said top silylated photoresist portion is by reactive ion etching using a chemistry comprising $Cl_2$ and $O_2$.

8. The method according to claim 1 wherein said etching of said inner unsilylated photoresist portion is by reactive ion etching using a chemistry comprising $O_2$, $N_2$ and He.

9. A method of fabrication of a crown shaped storage capacitor in an integrated circuit device comprising:

providing a semiconductor substrate where conductive plugs are formed through a dielectric layer;

depositing a first polysilicon layer overlying said conductive plugs and said dielectric layer;

depositing a photoresist layer overlying said first polysilicon layer;

patterning said photoresist layer to define a photoresist mask overlying said conductive plugs;

silylating said photoresist mask to form a top silylated photoresist portion overlying and silylated photoresist sidewalls adjacent to an inner unsilylated photoresist portion;

etching through said top silylated photoresist portion to expose the top surface of said inner unsilylated photoresist portion;

etching said inner unsilylated photoresist portion wherein a thin layer of said inner unsilylated photoresist portion is left overlying said first polysilicon layer;

etching said thin layer of said inner unsilylated photoresist portion and said first polysilicon layer and thereby forming crown shaped lower nodes of said storage capacitors leaving a thin layer of said first polysilicon layer overlying said dielectric layer wherein said silylated photoresist sidewalls act as an etching mask;

etching away remaining said silylated photoresist sidewalls;

depositing a capacitor dielectric layer overlying said crown shaped lower nodes of said storage capacitors and said dielectric layer;

depositing a second polysilicon layer overlying said capacitor dielectric layer and thereby forming the upper nodes of said storage capacitors; and completing said fabrication of said integrated circuit device.

10. The method according to claim 9 wherein said photoresist layer is deposited to a thickness of between about 2,000 Angstroms and 15,000 Angstroms.

11. The method according to claim 1 wherein said step of silylating is performed using a silylating agent from the group consisting of: dimethylsilyldimethylamine (DMSDMA), dimethylsilyldiethylamine (DMSDEA), dimethylaminopentamethyldisilane (DMDS), and N,N-dimethylamino-1,2dimethyldisilane (DMDS).

12. The method according to claim 9 wherein said etching through of said top silylated photoresist portion is by reactive ion etching using a chemistry comprising $Cl_2$ and $O_2$.

13. The method according to claim 9 wherein said etching of said inner unsilylated photoresist portion is by reactive ion etching using a chemistry comprising $O_2$, $N_2$ and He, and wherein said etching of said inner unsilylated photoresist portion is timed such that said inner unsilylated photoresist portion left overlying said first polysilicon is between about 1,000 Angstroms and 3,000 Angstroms.

14. The method according to claim 9 wherein said etching of said first polysilicon layer is by reactive ion etching using a chemistry comprising $Cl_2$, HBr, and $O_2$, and wherein said etching is timed such that said thin layer of first polysilicon left overlying said dielectric layer is between about 500 Angstroms and 2,000 Angstroms.

15. A method of fabrication of a cylindrical shaped storage capacitor in an integrated circuit device comprising:

provide a semiconductor substrate where conductive plugs are formed through a dielectric layer;

depositing a first polysilicon layer overlying said conductive plugs and said dielectric layer;

depositing a photoresist layer overlying said first polysilicon layer;

patterning said photoresist layer to define a photoresist mask wherein said photoresist mask intersects said conductive plugs;

silylating said photoresist mask to form a top silylated photoresist portion overlying and silylated photoresist sidewalls adjacent to an inner unsilylated photoresist portion;

etching through said top silylated photoresist portion to expose the top surface of said inner unsilylated photoresist portion;

etching through said inner unsilylated photoresist portion;

etching through said first polysilicon layer to form the cylindrical shaped lower nodes of said storage capacitors wherein said silylated photoresist sidewalls acts as an etching mask;

removing remaining said silylated layer of photoresist;

depositing a capacitor dielectric layer overlying said cylindrical shaped lower nodes of said storage capacitors and said dielectric layer;

depositing a second polysilicon layer overlying said capacitor dielectric layer and thereby forming the upper nodes of said storage capacitors; and completing said fabrication of said integrated circuit device.

16. The method according to claim 15 wherein said photoresist layer is deposited to a thickness of between about 2,000 Angstroms and 15,000 Angstroms.

17. The method according to claim 1 wherein said step of silylating is performed using a silylating agent from the group consisting of: dimethylsilyldimethylamine (DMSDMA), dimethylsilyldiethylamine (DMSDEA), dimethylaminopentamethyldisilane (DMDS), and N,N-dimethylamino-1,2dimethyldisilane (DMDS).

18. The method according to claim 15 wherein said etching through of said top silylated photoresist portion is by reactive ion etching using a chemistry comprising $Cl_2$ and $O_2$.

19. The method according to claim 15 wherein said etching through of said inner unsilylated photoresist portion is by reactive ion etching using a chemistry comprising $O_2$, $N_2$ and He, wherein an optical endpoint detection is used to stop said etching of said inner unsilylated photoresist portion.

20. The method according to claim 15 wherein said etching of said first polysilicon layer is by reactive ion etching using a chemistry comprising $Cl_2$, HBr, and $O_2$, wherein an optical endpoint detection is used to stop said etching of said first polysilicon layer.

* * * * *